(12) United States Patent
Nakano et al.

(10) Patent No.: US 7,175,875 B2
(45) Date of Patent: Feb. 13, 2007

(54) METHOD AND APPARATUS FOR PLASMA PROCESSING

(75) Inventors: Hiroyuki Nakano, Yokohama (JP); Toshihiko Nakata, Hiratsuka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/075,244

(22) Filed: Feb. 15, 2002

(65) Prior Publication Data
US 2003/0157242 A1 Aug. 21, 2003

(51) Int. Cl.
B05D 3/06 (2006.01)
H05H 1/24 (2006.01)
B08B 6/46 (2006.01)

(52) U.S. Cl. .................. 427/10; 427/569; 134/1.1; 216/60; 216/67

(58) Field of Classification Search .................. 427/8, 427/10, 569, 562; 216/67; 118/723 R, 665, 118/688, 689, 690, 691
See application file for complete search history.

(56) References Cited

U.S. PATENT DOCUMENTS

| | | | | |
|---|---|---|---|---|
| 5,255,089 A | * | 10/1993 | Dybas et al. | 358/101 |
| 5,367,139 A | * | 11/1994 | Bennett et al. | 219/121.59 |
| 5,536,359 A | * | 7/1996 | Kawada et al. | 438/16 |
| 5,943,130 A | * | 8/1999 | Bonin et al. | 356/336 |
| 6,346,425 B1 | * | 2/2002 | Ito et al. | 438/7 |
| 6,355,570 B1 | * | 3/2002 | Nakata et al. | 438/706 |
| 6,576,559 B2 | * | 6/2003 | Nakata et al. | 438/706 |
| 6,613,588 B2 | * | 9/2003 | Nakano et al. | 438/9 |
| 6,626,185 B2 | * | 9/2003 | Demos et al. | 134/1.1 |
| 6,712,928 B2 | * | 3/2004 | Nakano et al. | 156/345.24 |
| 6,750,977 B2 | * | 6/2004 | Otsubo et al. | 356/632 |
| 6,778,272 B2 | * | 8/2004 | Nakano et al. | 356/336 |
| 6,825,437 B2 | * | 11/2004 | Nakano et al. | 219/121.41 |

(Continued)

FOREIGN PATENT DOCUMENTS

JP 57-118630 7/1982

(Continued)

OTHER PUBLICATIONS

Thomson/Derwent machine translation of JP11-330053 to Nakano et al (previously cited), pub. Nov. 1999.*

(Continued)

Primary Examiner—Marianne Padgett
(74) Attorney, Agent, or Firm—Antonelli, Terry, Stout and Kraus, LLP

(57) ABSTRACT

The apparatus for processing an in-process substrate by generating a plasma have a processing chamber with an observation window, in which the in-process substrate is disposed; plasma generating means for generating a plasma in the inside of the processing chamber; irradiation means for projecting a light beam into the inside of the processing chamber through the observation window; detection means for detecting the light projected and reflected from the inside wall of the chamber by the irradiation means; and data processing means for obtaining information on the state of contamination of the inside wall of the processing chamber by processing signals obtained through detection of the reflected light by the detection means, and thereby permitting simultaneously monitoring of both the state of contamination of an inside wall of the processing chamber and foreign materials suspended in the processing chamber, with a single observation window and an optical system composed of one unit.

29 Claims, 10 Drawing Sheets

U.S. PATENT DOCUMENTS

| | | | |
|---|---|---|---|
| 6,994,769 B2* | 2/2006 | Singh et al. | 156/345.51 |
| 7,028,696 B2* | 4/2006 | Richardson et al. | 134/1.1 |
| 2003/0005943 A1* | 1/2003 | Singh et al. | 134/1.1 |
| 2003/0185966 A1* | 10/2003 | Kim et al. | 427/8 |
| 2004/0173310 A1* | 9/2004 | Baier | 156/345.24 |
| 2004/0253824 A1* | 12/2004 | Tegeder | 438/696 |

FOREIGN PATENT DOCUMENTS

| | | |
|---|---|---|
| JP | 03-025355 | 2/1991 |
| JP | 03-147317 | 6/1991 |
| JP | 06-082358 | 3/1994 |
| JP | 06-124902 | 5/1994 |
| JP | 10-213539 | 8/1998 |
| JP | 11-251252 | 9/1999 |
| JP | 11-330053 | 11/1999 |
| JP | 11-340196 | 12/1999 |
| JP | 2000-208448 | 7/2000 |
| JP | 2001-196431 | 7/2001 |

OTHER PUBLICATIONS

Thomsonh/Derwent machine trans. of JP11-251252 to Nakada et al (previously cited), pub. Sep. 1999.*

Thomson/Derwent mach. tras. of JP 11-340196 to Katsuyama et al (previously cited), pub. Dec. 1999.*

Trans. of previously cited JP03-025355 to Ecchu rt al, pub. Feb. 1991.*

Trans. of previously cited JP 57-118630 to Kawasaki, pub. Jul. 1982.*

* cited by examiner

METHOD AND APPARATUS FOR PLASMA PROCESSING

BACKGROUND OF THE INVENTION

1. Field of the Invention

The present invention relates to a method and an apparatus for manufacturing semiconductor devices such as a semiconductor substrate and a liquid crystal substrate. More particularly it relates to a method and an apparatus for treating the substrate with processing, equipped with a function of performing in-situ measurement of foreign materials in a processing chamber (a vacuum processing chamber) and the state of contamination of the processing chamber where the processing such as thin film growth (film formation) and etching is conducted.

2. Description of the Related Art

Processing that utilizes a plasma is widely applied to Semiconductor manufacturing processes and manufacturing processes of substrates for liquid crystal display devices as in the form of an etching apparatus or others.

For the processing apparatuses like the above that use the plasma, it is known that reaction products generated, for example, by an etching reaction exerted by the plasma processing are deposited on walls and/or electrodes in a plasma processing chamber. This deposit may peel off with the passage of time and become suspended foreign materials. These suspended foreign materials fall on a wafer to become adhesion foreign materials at the moment when the etching process is ended and the plasma discharge is stopped. This brings about malfunctioning properties of a circuit and defective pattern appearance to thereby decrease the yield and reduce the reliability on a semiconductor device.

Many apparatuses for inspecting the foreign materials adhering to the surface of an in-process substrate such as a wafer have been reported and some of which have been actually used. These are types such as to inspect the in-process substrate temporarily taken out from the plasma processing apparatus, and however suffer from following problem: when a number of foreign materials are found generated, the other wafers in the same lot have already undergone the processing. This leads to a mass generation of the defectives, decreasing the yield. In addition, even at the evaluation after the processing, those apparatuses can not cover distributions of the foreign materials and their changes with the lapse of time. Therefore, a technology of manufacturing semiconductors and liquid crystals needs in-situ monitoring of the state of contamination in the processing chamber. The size of the suspended foreign material in the processing chamber ranges from a few sub-micrometers to a few hundred μm. In the field of semiconductors where a degree of integration goes even higher, from 256 Mbit DRAM (Dynamic Random Access Memory) to 1 Gbit DRAM, the minimum line width of the circuit pattern is on a trend of approaching finer dimensions, say 0.25–0.18 μm, and accordingly the size of the foreign materials that must be detected is required to be as small as a few sub-micrometers.

The prior arts for monitoring the foreign materials suspended in the processing chamber (vacuum chamber) such as the plasma processing chamber are described in JP-A Nos. 118630/1982 (prior art 1), 25355/1991 (prior art 2), 147317/1991 (prior art 3), 82358/1994 (prior art 4), 124902/1994 (prior art 5), 213539/1998 (prior art 6), 251252/1999 (prior art 7), and 330053/1999 (prior art 8).

The prior art 1 discloses an evaporation apparatus equipped with a means for projecting a parallel beam having a different spectrum from that of the spontaneous emission light in a reaction space and a means for detecting scattered light from particulates generated in the space that are subjected to irradiation of the parallel beam.

The prior art 2 discloses a fine-particle measuring apparatus for measuring fine particles adhering to the surface of a semiconductor device substrate and suspended fine particles by means of a laser light scattering. The apparatus comprises: a laser light phase modulator part for generating two laser beams that have the same wavelength and were modulated by two signals of a predetermined frequency, having predetermined phases different to each other; an optical system for making the two laser light beams to intersect in a space containing fine particles that are subjects of the above measurement; an optical detecting part for receiving light scattered by fine particles that are subjects of the measurement in an area where the two laser light beams are made to intersect with each other and for converting the light into an electric signal; and a signal processing part for extracting a signal component, from among electric signals caused by this scattered light, whose frequency is either the same as or twice as much as that of the phase modulated signal at the laser light phase modulator part and such that its phase difference with respect to the phase modulated signal is temporally constant.

The prior art 3 describes a technology that includes the steps of: projecting coherent light into a reaction vessel in a scanning manner to generate light that scatters therein; and detecting light that scatters in the reaction vessel; and whereby the state of contamination of the reaction vessel is measured by means of analysis of the scattered light obtained by these steps.

The prior art 4 describes a particle detector comprising: scanning means for scanning an area in a reaction chamber of a plasma processing tool containing particles to be observed with the laser light; a video camera for generating a video signal of the laser light that has been scattered by the particulates in the area; and a means for processing and displaying the image of the video signal.

The prior art 5 describes a plasma processing apparatus comprising: a camera device for observing a plasma generation area in a plasma processing chamber; a data processing part for processing images obtained by the said camera device to obtain target information; and a control part for controlling at least one of exhaust means, process-gas introducing means, high-frequency voltage applying means, and purge-gas introducing means so that particles can be reduced in number based on the information obtained by the said data processing part.

The prior art 6 describes a small particulate sensor that comprises (1) a detector including: (a) a light emitter for emitting a light beam that traverses and irradiates a measurement volume, (b) an optical detector, and (c) an optical system for collecting scattered light from the measurement volume and directing the light to the optical detector, wherein the detector is configured to generate a signal that indicates the intensity of the light directed to the optical detector, and (2) signal processing means including: (e) a pulse detector that is interconnected with the optical detector so as to analyze the signal sent from the optical detector and detects pulses in the signals from the optical detector, and (f) an event detector for identifying a series of pluses that correspond to particulates and result from scattered light caused by the particulates in association with plural times of irradiation scans by the beam during when the particulates move in the measurement volume. Furthermore, the prior art 7 discloses a composition of a plasma suspension foreign-material measuring apparatus that is a plasma processing apparatus for generating a plasma in the processing chamber and treating the object to be processed with the said plasma, the apparatus comprising: an irradiation optical system, for projecting light that has a desired wavelength and has been intensity-modulated by the desired frequency into the processing chamber; scattered-light detecting optical system for separating the scattered light obtained from the processing chamber into the desired wavelength components and receiving them to effect their conversion into signals; and foreign-object signal extracting means for separating the signal indicating the suspended foreign material in the plasma or in its vicinity to effect detection by extracting a component of a desired frequency at which the intensity modulation has been performed from the signal obtained by the said scattered-light detecting optical system. Furthermore, the prior art 8 discloses a composition of a plasma suspension foreign-material measuring apparatus that is a plasma processing apparatus for generating a plasma in the processing chamber and treating the object to be processed with the said plasma, the apparatus comprising: an irradiation optical system for projecting a plurality of light beams that have mutually different wavelengths and were intensity-modulated by a desired frequency into the processing chamber; a scattered-light detecting optical system for separating the scattered light into a plurality of wavelength components whose wavelengths are mutually different and for receiving and converting them into plural signals; and foreign-material signal extracting means for separating the signal indicating the suspended foreign material in the plasma or in its vicinity to effect detection by extracting a component of a desired frequency at which the intensity modulation has been performed from the signal obtained by the said scattered-light detecting optical system.

Note that in the prior arts 1–6, the apparatuses are configured so as to project laser light into the plasma processing chamber through an observation window provided on a side thereof and detect the forward scattered laser light or lateral scattered laser light from an observation window that is discrete from the laser irradiation observation window and has been provided on an opposing side or other sides. Therefore, in these schemes that detect the forward scattered light or the lateral scattered light, the irradiation optical system and the detection optical system are constructed in discrete units, hence two observation windows for which these optical systems are installed, respectively, are necessary, and optical axis alignment needs to be conducted for the irradiation optical system and for the detection optical system, respectively; consequently their handling is troublesome.

In addition, normally, almost any models of the apparatus are equipped with the observation window provided on a side of the processing chamber such as the plasma processing chamber with the intention to monitor plasma emission, but it is quite many cases where only one observation window is provided. Therefore, there is a problem that any conventional technique that requires two observation windows cannot be applied to manufacturing equipment equipped with only one observation window.

In the conventional schemes whereby the forward scattered light or the lateral scattered light is detected, if the operator intends to scan the irradiation beam that is to be projected into the plasma processing chamber rotationally so as to observe a state of foreign material generation on the whole surface of the in-process substrate such as a wafer, a number of observation windows and detection optical systems are needed, which introduces a cause of considerable increase in cost, and it is also anticipated that, from a practical pint of view, it is extremely difficult to provide a number of observation windows and the detection optical systems because of constraints of a space factor.

On the other hand, in the field of semiconductor devices where a trend of higher packing densities toward 256 Mbit DRAM and even further toward 1 Gbit DRAM has been taking place, the minimum line width of the circuit pattern goes to thinner dimensions such as 0.25–0.188 μm, and accordingly the size of the foreign materials that must be detected is required to be as small as sub-micrometers. However, the prior arts 1–6 are limited to applications to observe comparatively large foreign materials because of difficulty in separating the foreign-material scattered light from the plasma emission, and it is considered to be difficult to detect minute foreign materials of the order of sub-micrometers.

In the prior arts 7–8, a problem of how to detect the foreign materials suspended in the plasma or in its vicinity is described, but a problem of how to detect the status of contamination of the foreign materials adhering to or deposited on the inside wall of the plasma processing chamber is not considered.

SUMMARY OF THE INVENTION

The present invention aims at providing a method and an apparatus for detecting the state of contamination of the inside wall of the plasma processing chamber in the apparatus for plasma processing such as etching, sputtering, CVD, and thereby predicting a situation where plenty of foreign materials will be generated on the in-process substrate and directing execution of a countermeasure, such as cleaning, in an early stage of contamination, so that a large quantity of defectives can be prevented from occurring.

Further, the present invention provides a method for manufacturing a semiconductor whereby the state of contamination of the inside wall of the plasma processing chamber can be detected and also foreign materials suspended in the plasma processing chamber can be detected, and consequently a countermeasure to prevent a high volume of foreign materials from being generated on the in-process substrate in an earlier stage of contamination is executed, so that a large quantity of defectives can be prevented from occurring, and a method and an apparatus for the same.

Still further, the present invention provides a plasma processing method and a plasma processing apparatus wherein an irradiation and detection optical system for detecting the status of contamination of the inside wall and suspended foreign materials is made to be compact and thereby its installation in a limited narrow space can be realized.

That is, the present invention provides the plasma processing method for generating a plasma in the processing chamber in which the in-process substrate is disposed and treating the in-process substrate with the plasma processing using the plasma generated in the processing chamber in such a way that: a light beam is projected into the processing chamber through an observation window, reflected light from the inside wall of the processing chamber resulting from this irradiation is detected through the observation window, and signals obtained through detection of this reflected light are processed, and thereby information on the state of contamination of the inside wall of the processing chamber can be obtained. Moreover, the plasma processing method is modified so as to control the plasma processing for the in-process substrate based on the obtained information on the state of contamination of the inside wall.

Yet further, the present invention provides the plasma processing method for generating a plasma in the processing chamber in which an in-process substrate is disposed and treating the in-process substrate with the plasma processing using the plasma generated in the processing chamber in such a way that: the light beam is projected into the processing chamber through the observation window; the reflected light that has been reflected from the inside of the processing chamber resulting from this irradiation and passed through the observation window is branched; one of branched portions of the reflected light is detected to obtain the information on the foreign materials suspended in the processing chamber; and the other of branched portions of the reflected light is detected to obtain the information on the state of contamination of the inside wall of the processing chamber. Moreover, the plasma processing method is modified so as to control the plasma processing for the in-process substrate based on information on the foreign materials suspended in the processing chamber and information on the state of contamination of the inside wall of the processing chamber.

Further, regarding the state of the contamination of the inside wall of the processing chamber and the suspended foreign materials, the present invention modifies the plasma processing method so as to distinguish and display the number of these substances, the size thereof, and a distribution on the monitor of a display.

As described above, according to the present invention, the capability of always grasping the state of contamination of the inside wall of the processing chamber makes it possible to predict the occurrence of a large number of suspended foreign materials in an early stage and control the plasma processing for the in-process substrate (i.e., to devise various countermeasures, such as stopping the in-process substrate from being put into the production line, executing the cleaning, or the like, and together with monitoring the conditions of the processing.), and thereby a large quantity of defectives are prevented from being manufactured, hence improving the yield extremely.

These and other objects, features and advantages of the invention will be apparent from the following more particular description of preferred embodiments of the invention, as illustrated in the accompanying drawings.

DESCRIPTION OF THE PREFERRED EMBODIMENTS

Hereafter, referring to FIG. 1 through FIG. 15, the embodiments according to the present invention will be described.

Each of the embodiments applies a parallel plate type plasma etching apparatus used as the plasma dry etching apparatus. Note that the application range of the present invention is not limited to these. And the present invention can also be applied to thin film generation (film formation) apparatuses such as a sputtering apparatus, a CVD apparatus, various apparatuses for generating or processing thin film such as an ECR etching apparatus, a micro wave etching apparatus, and an ashing apparatus.

Figure 1:
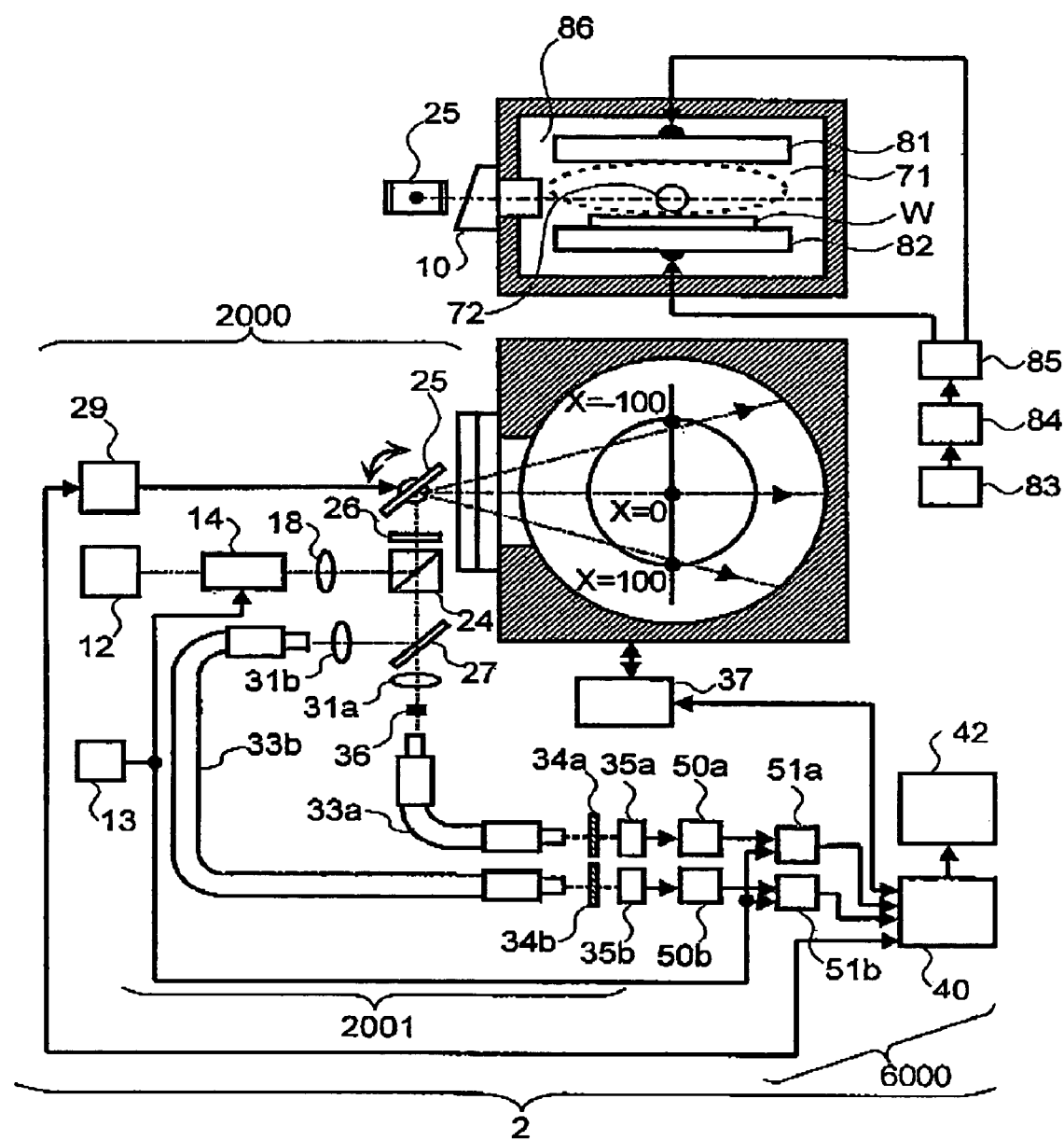
FIG. 1 shows a composition of the etching apparatus with a measurement instrument for suspended foreign material in plasma having a function of monitoring the state of contamination of inside wall of processing chamber, according to a first embodiment of the present invention.

First embodiment according to the present invention will be described referring to FIG. 1 through FIG. 13. FIG. 1 shows a composition of a plasma etching apparatus that has the measurement instrument for suspended foreign material in plasma equipped with the function of monitoring the state of contamination of inside wall of processing chamber, according to this first embodiment. That is, the first embodiment according to the present invention is an apparatus for performing various processing such as etching and ashing that has been provided with a measuring instrument capable of monitoring the state of contamination of the inside wall of the processing chamber.

As shown in FIG. 1, the etching apparatus is operated as follows: an output voltage of a power amplifier 84 is modulated to a high-frequency signal from a signal modulator 83; this high-frequency voltage is distributed by a distributor 85 and is applied between an upper electrode 81 and a lower electrode 82 that are arranged in parallel to each other in the plasma processing chamber 86; a plasma 71 is generated from an etching gas by a discharge between both electrodes; and a semiconductor substrate (wafer) W as a body to be processed is etched by its active species. For the high frequency signal, for example, a 400 kHz signal is used.

A measurement instrument 2 for suspended foreign material in plasma equipped with the function of monitoring the state of contamination of inside wall of processing chamber is mainly composed of a laser illumination optical system 2000, a scattered-light detecting optical system 2001, and a control and signal processing system 6000, wherein the laser illumination optical system 2000 and the scattered-light detecting optical system 2001 have an illumination light exit and a detected light entrance, respectively, both of which are disposed so as to face an observation window 10 provided on the side of the plasma processing chamber 86.

In the laser illumination optical system 2000, first, an S polarized beam 101 emitted from a laser light source 12 (e.g., of a wavelength of 532 nm) is made to enter an AO (Acousto-Optical) modulator 14. To the AO modulator 14, a signal outputted from an oscillator 13, for example, a rectangular wave of a frequency of 170 kHz and with a duty ratio of, preferably, 50%, is applied according to a control signal from a computer 42, and the S polarized beam is intensity-modulated by the frequency. Here, in this embodiment wherein the high-frequency to be applied to the electrodes of the etching apparatus is specified to be 400 kHz, preferably a laser intensity modulation frequency is the 170 kHz etc. that is different from 400 kHz and its harmonics (integral multiples thereof); 800 kHz, 1.2 MHz, . . . . The reason will be described later.

The intensity-modulated S polarized beam 102 that is to be focused to the vicinity of the center of a wafer (wafer in process) W by a focusing lens 18 is reflected by a polarizing beam splitter 24 with a low loss, is converted into a circularly or elliptically polarized beam 103 by a wave plate 26 such as a quarter wave plate, and subsequently is reflected by a Galvano mirror 25, and is guided to the inside of the processing chamber through the observation window 10 provided on a side of the plasma processing chamber 86. Here, by the Galvano mirror 25 being rotated to scan the circularly or elliptically polarized beam 103 in a plane parallel to the plane of the wafer W, irradiation through a space just above the whole wafer surface (foreign material detection) becomes possible.

Here, the reason of provision of the wave plate 26 such as a quarter wave plate is to make it possible to allow the scattered reflected light from the inside wall 5 of the processing chamber to pass through the polarizing beam splitter 24, so that it can be received with a processing chamber's reflected-light detecting optical fiber 33b.

Note that where the state of contamination of the inside wall 5 of the plasma processing chamber 86 is intended to be monitored, it means that only a specific location of the plasma processing chamber needs to be monitored and so it is not necessarily required for the circularly or elliptically polarized beam 103 to be scanned in a plane parallel to the plane of the wafer W. However, where the status of contamination of the inside wall 5 of the plasma pollution level in inside wall 5 of plasma processing room 86 and at the same time the foreign materials 72 suspended above the wafer W are intended to be monitored, it is preferable that the circularly or elliptically polarized beam 103 is scanned in a plane parallel to the plane of the wafer W.

Then, where an entrance plane of the observation window 10 is constructed in parallel to the side wall, reflected light by specular reflection from the observation window 10 is reflected by the Galvano mirror 25 and passes through the wave plate 26 such as a quarter wave plate again to become P polarized light, which passes through the polarizing beam splitter 24, is detected by the scattered-light detecting optical system 2001, and creates a large noise. Then, by constructing the entrance plane of the observation window 10 with a slanting plane, the reflected light from this plane is misaligned from the detected light axis so as not to enter the scattered-light detecting optical system 2001, and hence the noise resulting from the reflected light directly from the observation window 10 is being prevented.

Next, a method for detecting the foreign-material scattered light will be described. The circularly or elliptically polarized beam 103 guided into the inside of the plasma processing chamber 86 is scattered by the suspended foreign materials 72 in the plasma. Among the said foreign-material scattered light rays, the backward scattered light rays propagating on the same optical axis as that of the irradiation circularly or elliptically polarized beam 103 in a reverse direction passes through the observation window 10, is reflected by the Galvano mirror 25, and travels toward the polarizing beam splitter 24. Among the said backward scattered light rays, a circular polarized component that corresponds to the specular reflection component passes through the wave plate 26 such as a quarter wave plate again to become a P polarized beam 104, which passes through the polarized beam splitter 24 with only a small loss and travels toward the beam splitter (branching optical system) 27. A major potion of the P polarized beam 104 passes through the beam splitter (branching optical system) 27 and is converged to an entrance facet of a foreign-material scattered light detecting optical fiber 33a by an imaging lens 31a.

Figure 2:
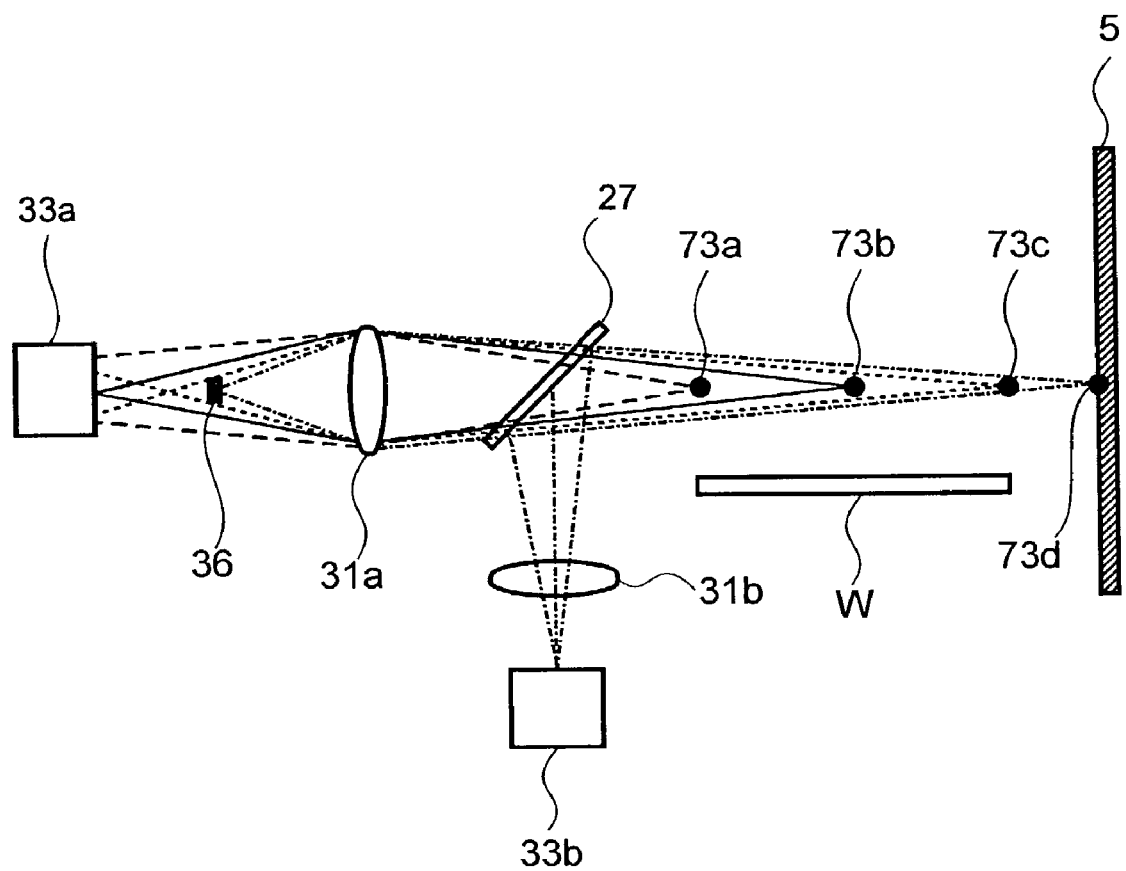
FIG. 2 explains an optical system for detecting the foreign-material scattered light and the reflected light (scattered light) from the inside wall of the processing chamber in a simplified representation.

Although, as shown in FIG. 2, a center position 73b of the wafer W and the entrance facet of the detecting optical fiber 33a are in a relation of imaging, a light-receiving area of the entrance facet is set to be a size capable of detecting also the scattered light rays from both wafer edges 73a, 73c both of which are in defocus planes. Therefore, foreign-material backward scattered light rays for locations ranging from in front of the wafer to at the back end of the wafer can be detected by the detecting optical fiber 33a with almost the same sensitivity. To secure a large light-receiving area, a method of using a bundle fiber or a liquid light guide is effective. Since the scattered light rays generated at the inside wall 5 of the processing chamber are imaged in front of the light-receiving plane of the foreign-material scattered light detecting optical fiber 33a (at a position of the spatial filter 36), the scattered light generated at the inside wall 5 of the processing chamber is cut off by disposing a spatial filter 36 at the said imaging position. An exit facet of the foreign-material scattered light detecting optical fiber 33a is coupled to a spectroscope 34a, such as a monochromator and an interference filter each of whose wavelengths is set to the wavelength of the laser light source 12. By the said spectroscope 34a, only a component whose wavelength is that of the foreign-material scattered light is separated from the plasma emission in terms of wavelength, and subsequently is subjected to photoelectric conversion by a photoelectric transducer 35a such as a photodiode and a photomultiplier. The detected signal undergone the photoelectric conversion is amplified by an amplifier 50a, and subsequently is subjected to synchronous detection using a rectangular signal of a frequency of 170 kHz and with a duty ratio of 50% that has been outputted from the oscillator 13 that has been used for the intensity modulation of the laser light as a reference signal by a lock-in amplifier 51*a*, extracting the foreign material-originated scatter light component from the detected signal.

Figure 3:
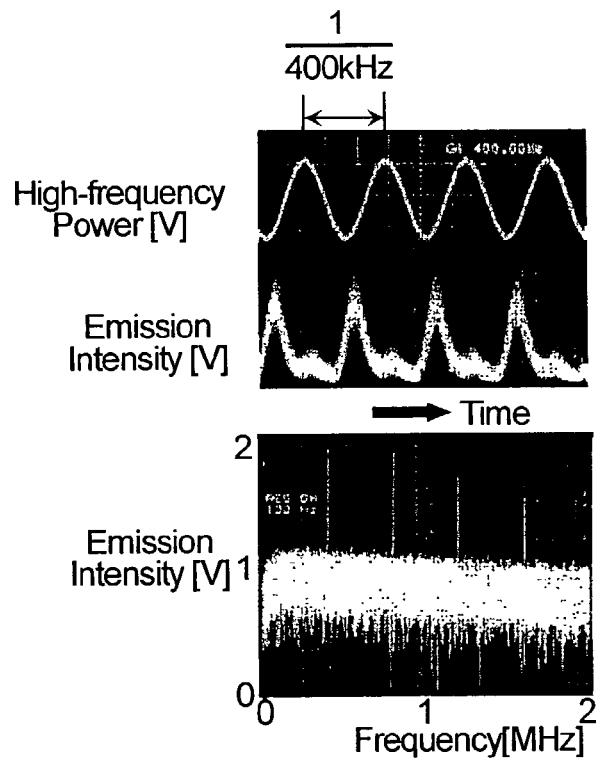
FIG. 3 explains a plasma excitation frequency is synchronized with the plasma emission.
Figure 4:
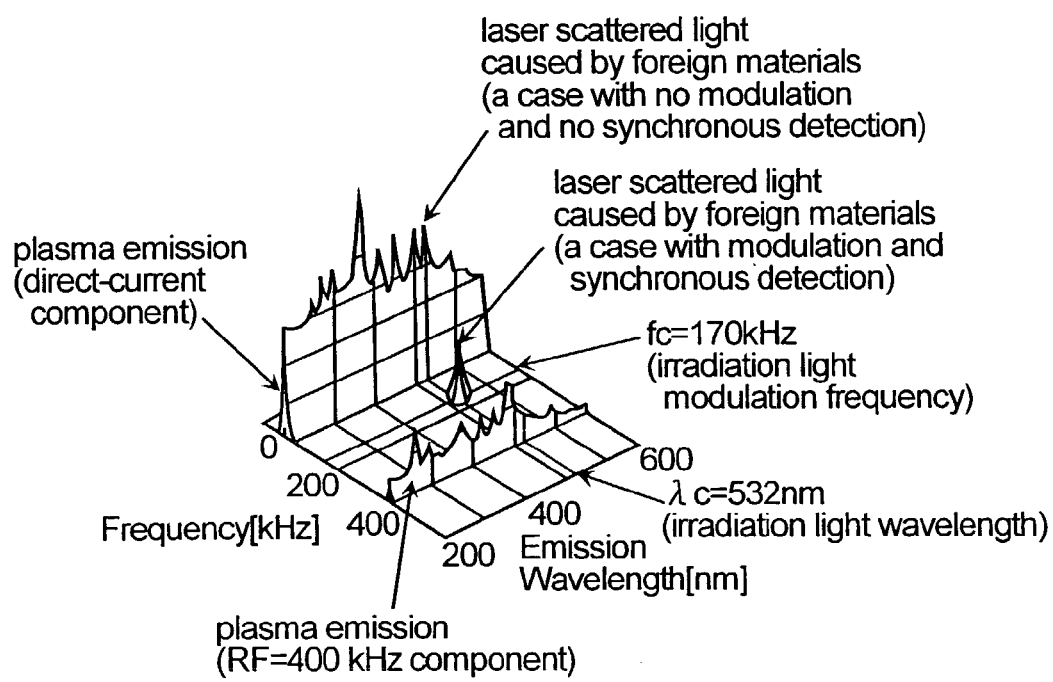
FIG. 4 explains how the foreign-material scattered light is separated from the plasma emission in a frequency region as well as in the wavelength region.
Figure 5:
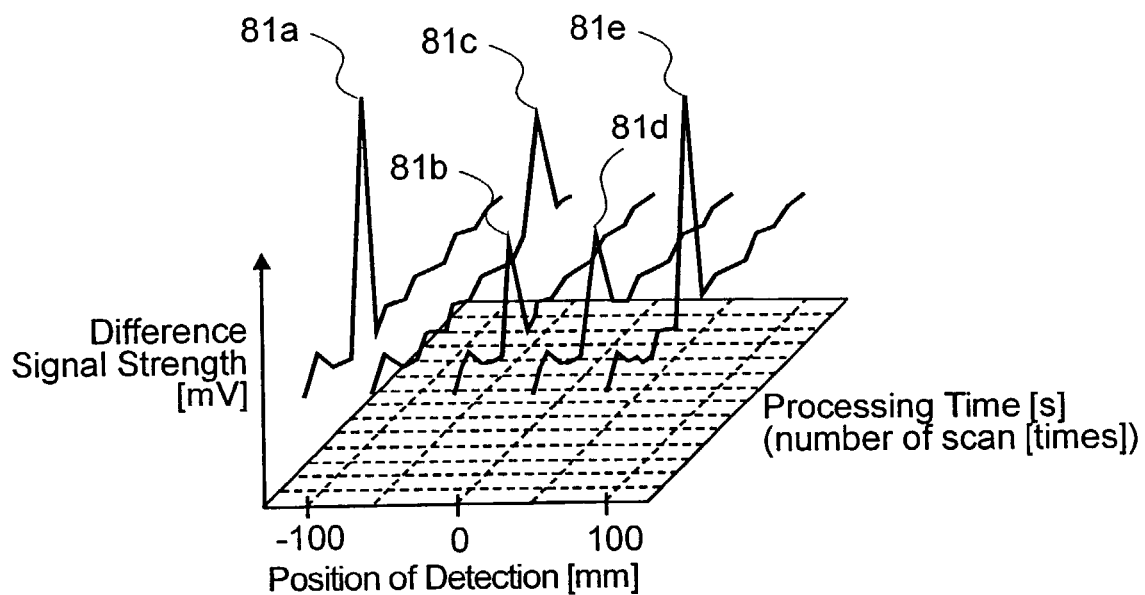
FIG. 5 shows a temporal variation in the detected light intensity for 5 spots on the wafer in the first embodiment according to the present invention.

As shown in FIG. 3, the inventors of the present invention has verified that the strength of the plasma emission is synchronous with the modulation frequency of the high-frequency power for exciting a plasma, and so, for example, the foreign-material signal that has been obtained by separation from the plasma emission generated by the high-frequency power of a plasma exciting frequency of the 400 kHz by the spectroscope 34 and by modulating and synchronously detecting at the frequency of 170 kHz that is different from the plasma exciting frequency and its integral multiples is, as shown in FIG. 4, separated in two regions of wavelength and frequency from the plasma emission. The inventors of the present invention has confirmed that by this method it is possible to detect the weak foreign-material scattered light from the plasma emission with high sensitivity. That is, as shown in FIG. 4, the plasma emission exhibits a continuos distribution in the wavelength region, whereas in the frequency region the distribution exists in a discrete manner and there are empty regions therein. Therefore, if laser light, for example, of a wavelength of 532 nm is intensity-modulated by, for example, a frequency of 170 kHz that is different from the modulation frequency of the plasma emission and is made to enter the plasma processing chamber 86 and only a component of a wavelength of 532 nm and of a frequency of 170 kHz, namely a peak signal, is extracted from the detected light, it become possible to separate the scattered light originated from the foreign materials from the plasma emission to effect detection.

In this way, by the spatial filter 36 being placed at an imaging position in front of the light-receiving plane of the foreign-material scattered light detecting optical fiber 33*a*, it become possible to cut off the scattered light generated at the inside wall 5 of the processing chamber and to make the scattered light from the suspended foreign materials above the wafer W enter the foreign-material scattered light detecting optical fiber 33*a*. Further, by the wavelength and the intensity modulation frequency of the laser light that enters the plasma processing chamber 86 being made to differentiate from the wavelength and the frequency of the plasma emission, it becomes possible to separate the scattered light originated from the suspended foreign material from the plasma emission to effect detection.

Figure 6:
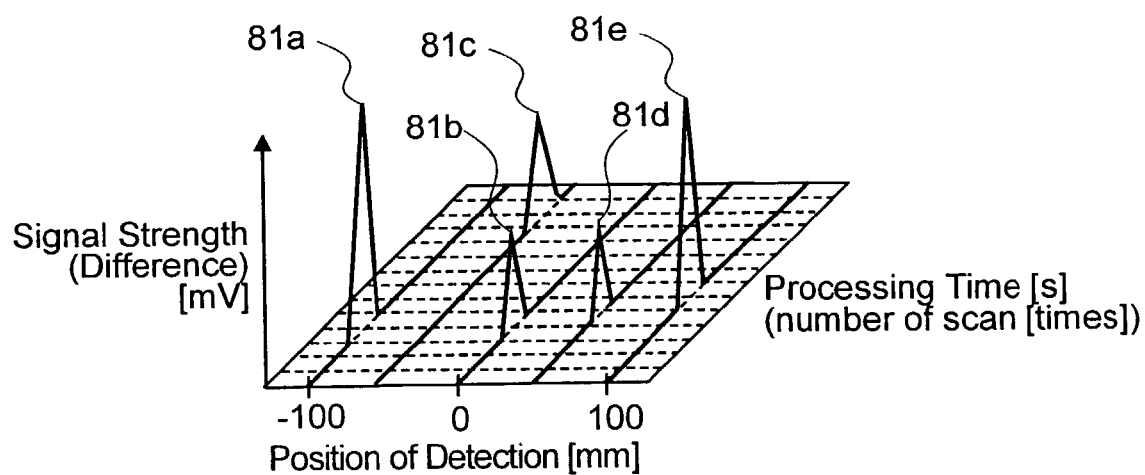
FIG. 6 shows a temporal variation in the foreign-material signal strength for 5 spots on the wafer in the first embodiment according to the present invention.

Then the output of the lock-in amplifier 51*a* is sent to the computer 42. The computer 42 sends a scanning signal to the Galvano mirror 25 through a Galvano driver 29 and, while keeping the beam scanning, displays the foreign material signals that were taken in at respective scanning positions in a display 41, for example, as in the form shown in FIG. 5, from point to point. The judgment of the foreign-material signal becomes easy if the computer 42 takes the difference between the output at the n-th scanning and the output at the (n−1)th scanning and displays only variations exceeding a certain value in the display 41 as shown in FIG. 6. The said display example shows the measured results for 5 lines of irradiation light on a wafer of φ 200 mm. If the scattered light is generated by the foreign materials suspended in the plasma, pulse-like large signals 81*a*, 81*b*, 81*c*, 81*d*, and 81*e* appear as shown at five locations in the FIG. 6. The computer 42 judges the size of the foreign material by comparing signal strengths for different particle sizes that have been obtained beforehand experimentally and the detected foreign-material signal strength, judges the number of the foreign materials from the number of the pulse-like signals, and judges a position of occurrence of the foreign material from the scanning position when the signal has been detected. Moreover, the computer 61 can determine the state of contamination in the processing chamber from the judged number of the foreign materials, the judged size thereof, etc. and if the total number of the occurrence of the foreign materials exceeds the previously set reference value, the computer 61 outputs information such as ending the etching process, calling attention of the operator of the processing apparatus to the state of contamination by an alarm etc.

Figure 7:
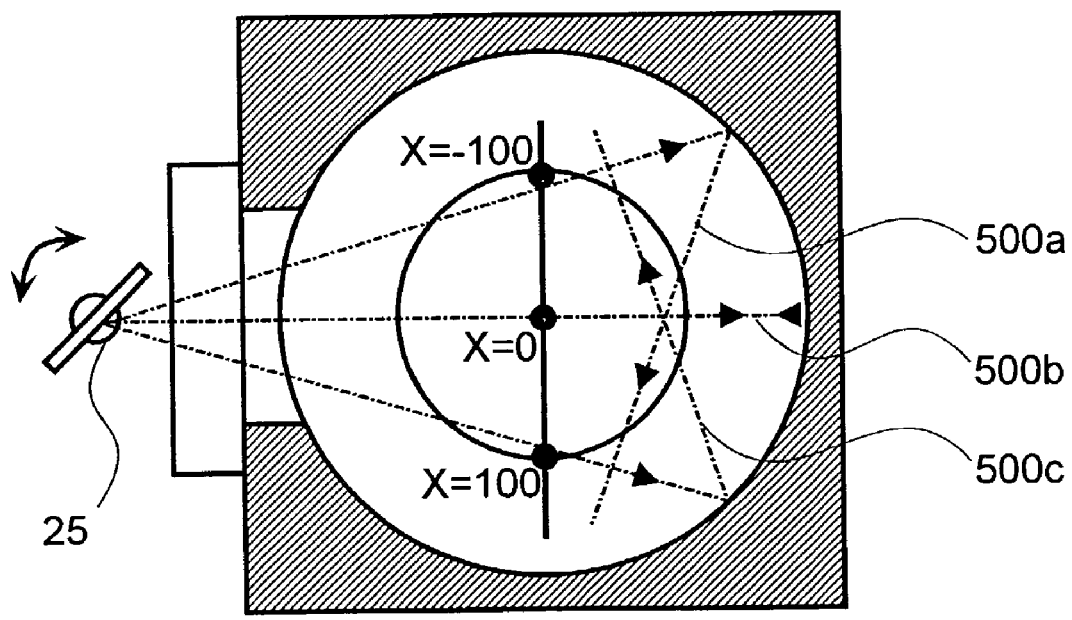
FIG. 7 shows how the irradiation laser light is reflected from the inside wall of the processing chamber in the first embodiment according to the present invention.

Next, a method for detecting the scattered light from the inside wall of the processing chamber. The circularly or elliptically polarized beam 103 that has been guided into the plasma processing chamber 86 hits the inside wall 5 of the plasma processing chamber 86. At this time, conditions of the reflection and scattering may differ depending on the surface state of the inside wall 5 of the said plasma processing chamber 86. FIG. 7 shows a case where the surface state of the inside wall 5 of the plasma processing chamber 86 is a state of being flat with a small amount of irregularity. Where the surface state of the inside wall 5 of the plasma processing chamber is the state of being flat with a small amount of irregularity (a state of non-contamination just after the washing or cleaning in which adhesion of the reaction products and the plasma damage are little), a major portion of the circularly or elliptically polarized beam 103 that hits the inside wall 5 of the said plasma processing chamber 86 is reflected. Therefore, where the beam is scanned in a plane parallel to the plane of the wafer by rotating the Galvano mirror 25, when the beam scanning position is in the wafer center, a major portion of the reflected light from the inside wall 5 of the plasma processing chamber 86 passes through the observation window 10, is reflected by the Galvano mirror 25, and travels toward the polarizing beam splitter 24.

Since the major portion of the reflected light (scattered light) from the inside wall 5 of the plasma processing chamber 86 is a circular polarization component corresponding to a specular reflection component, by the passing through the wave length plate 26 such as a quarter wave plate again, it becomes the P polarized beam 105, which passes through the polarizing beam splitter 24 with a low loss and travels toward the beam splitter (branching optical system) 27. A part of the P polarized beam 105 is reflected at the beam splitter 27 and is focused on the entrance facet (a position of a pin-hole 39) of the processing chamber's reflected-light detecting optical fiber 33*b* by an imaging lens 31*b* Since the pin-hole (diaphragm) 39 is provided at such a position, in front of the processing chamber's reflected-light detecting optical fiber 33*b*, that is in an imaging relation with the inside wall 5 of the plasma processing chamber 86 via the lens 31*b*, what can pass through the said pin-hole 39 is only the reflected light (scattered light) from the inside wall 5 of the plasma processing chamber 86 and a part of the plasma emission of strong emission intensity. As a result, the processing chamber's reflected-light detecting optical fiber 33*b* will detect the reflected light (scattered light) from the inside wall 5 of the plasma processing chamber 86 and the part of the plasma emission of strong emission intensity Thus, since a part of the plasma emission of strong emission intensity is guided to enter the processing chamber's reflected light detecting optical fiber 33*b*, the signal resulting from part of the plasma emission needs to be erased, as will be described in the following.

That is, since the exit facet of the processing chamber's reflected-light detecting optical fiber 33*b* is coupled to the spectroscope 34*b*, such as a monochromator and an interference filter each of whose wavelengths is set to the wavelength of the laser light source 12, only a component of the wavelength of the reflected light from the inside wall 5 is separated from the plasma emission in terms of the wavelength by the said spectroscope 34$b$, and then is subjected to the photoelectric conversion by the photoelectric conversion device 35$b$ such as a photodiode and a photomultiplier. The detected signal that has been subjected to photoelectric conversion is amplified by the amplifier 50$b$, and subsequently synchronously detected by a lock-in amplifier 51$b$ using the rectangular wave signal of a frequency of 170 kHz and of a duty ratio of 50% that is outputted from the oscillator 13 that has been used for intensity modulation of the laser light as a reference signal, extracting the reflected light (scattered light) component of a frequency of 170 kHz reflected from the inside wall 5 from the detected signal. An output of the lock-in amplifier 51$b$ is sent to the computer 42. The computer 42 sends a scanning signal to the Galvano mirror 25 through the Galvano driver 29 and, while keeping the beam scanning, displays a signal that indicates the status of contamination of the inside wall 5 that has been taken in at each scanning position in the display 41, for example, as in the form shown in FIG. 13, from point to point. Here, when the beam scanning position deviates from the wafer center, the reflected light from the inside wall 5 of the plasma processing chamber 86 scarcely enters the scattered-light detecting optical system 2001 because the propagation optical axis thereof shifted from the irradiation light optical axis.

Figure 9:
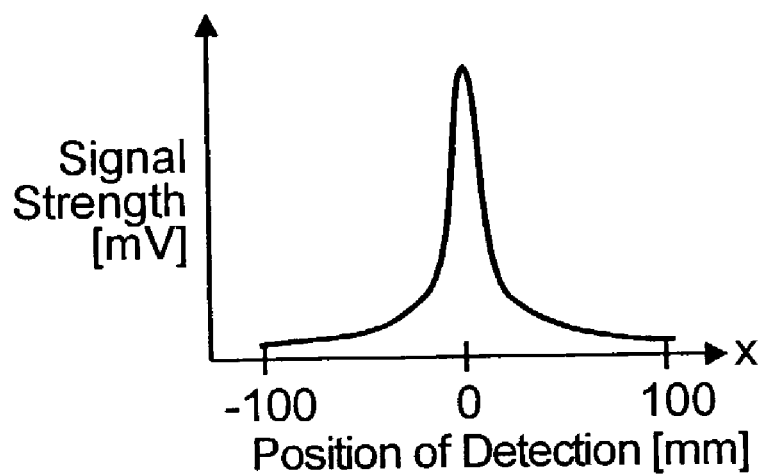
FIG. 9 shows a profile of the signal strength of the reflected (scattered) light from the inside wall of the processing chamber.
Figure 10:
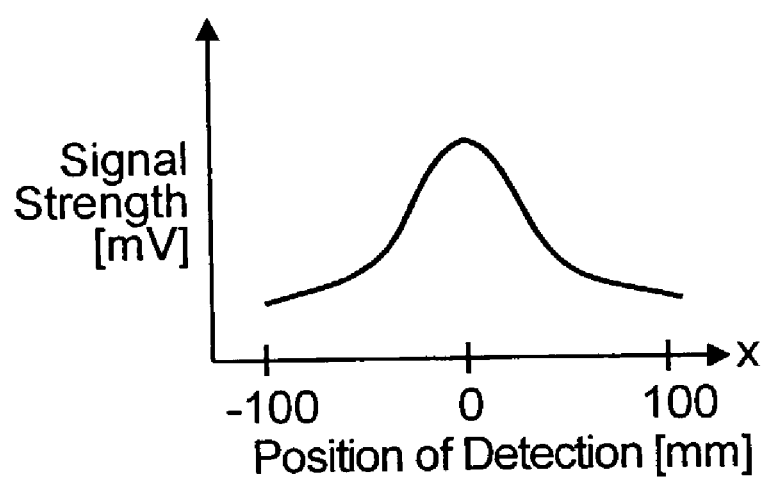
FIG. 10 shows the profile of the signal strength of the reflected (scattered) light from the inside wall of the processing chamber.
Figure 11:
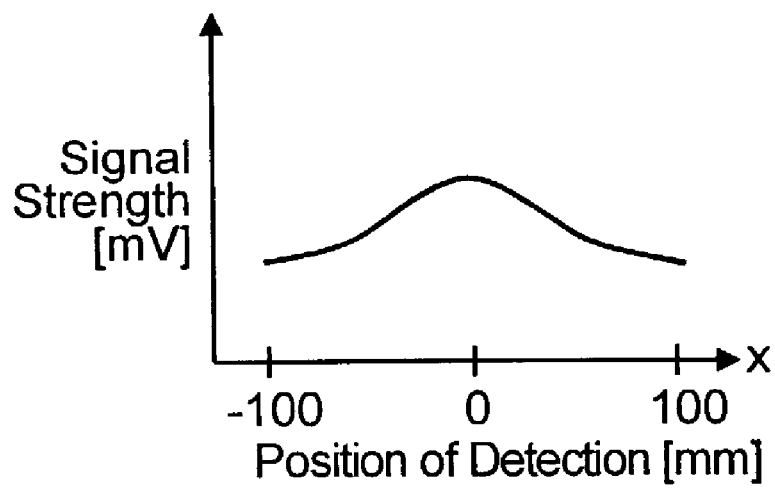
FIG. 11 shows the profile of the signal strength of the reflected (scattered) light from the inside wall of the processing chamber.
Figure 12:
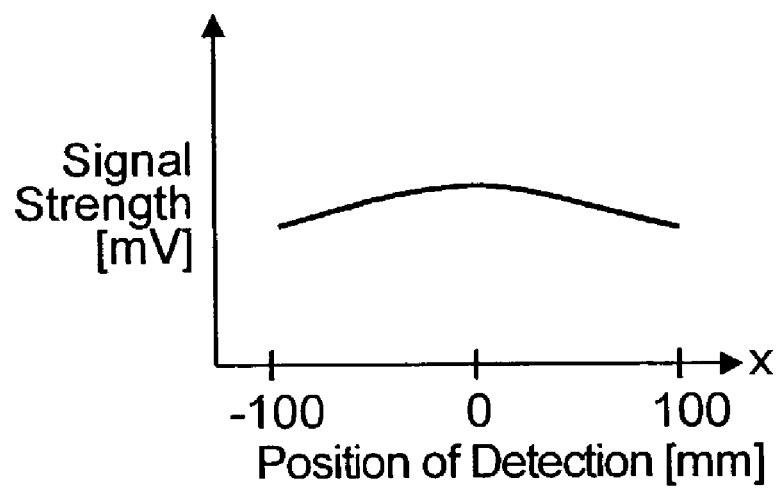
FIG. 12 shows the profile of the signal strength of the reflected (scattered) light from the inside wall of the processing chamber.
Figure 13:
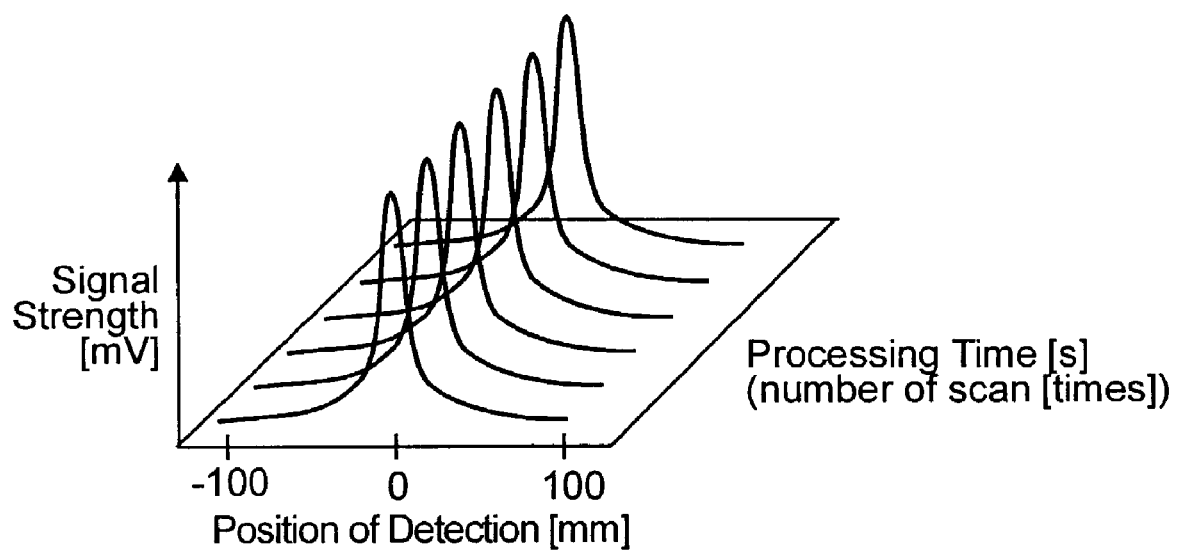
FIG. 13 shows a temporal variation in the profile of the signal strength of the reflected (scattered) light from the inside wall of the processing chamber.

As described above, when the surface state of the inside wall 5 of the plasma processing chamber 86 is a state of being flat with a small amount of irregularity (i.e., a state of non-contamination just after the washing or cleaning where adhesion of the reaction products and plasma damage are little), the shape of the detected signal obtained by one time beam scanning is, as shown in FIG. 9, such a shape that the signal strength is large in the center of the wafer and small in the edge of the wafer.

Figure 8:
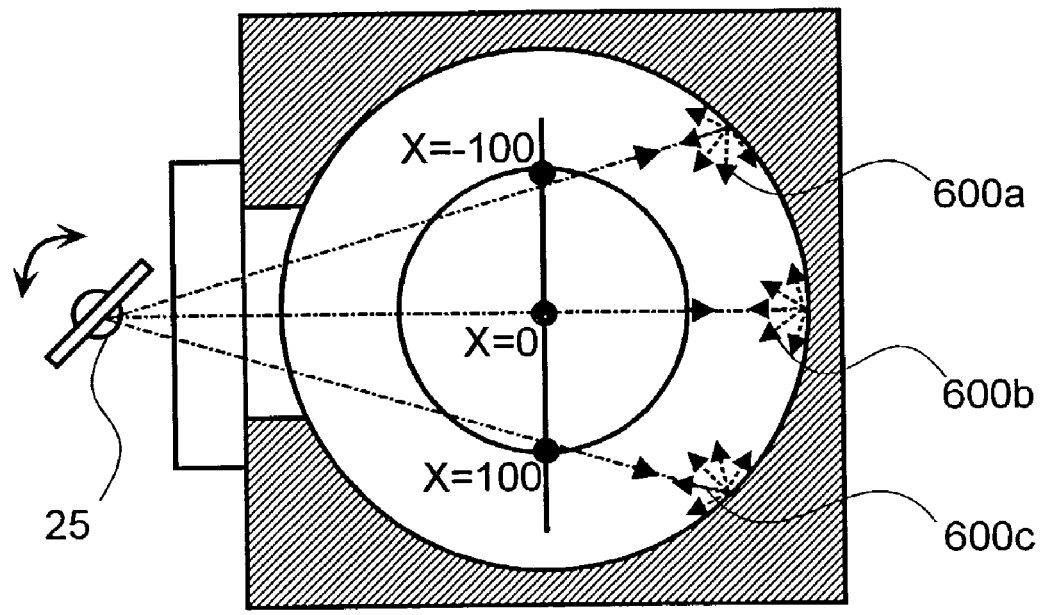
FIG. 8 shows how the irradiation laser light is scattered on the inside wall of the processing chamber in the first embodiment according to the present invention.

In contrast to this, as the plasma processing is being devised, the inside wall 5 of the processing chamber 86 is being contaminated because of adhesion of the reaction products and because of the development of damages caused by the plasma, and on the surface of the inside wall 5 the irregularity comes to be generated. FIG. 8 shows a case where the inside wall 5 of the processing chamber 86 has been contaminated and the irregularity has been developed on its surface.

Thus, when the inside wall 5 has been contaminated to develop the irregularity, a major portion of the circularly or elliptically polarized beam 103 that hits the inside wall 5 will be scattered. Therefore, when the Galvano mirror 25 is being rotated and the beam 103 is scanned in a plane parallel to the plane of the wafer, as an amount of irregularity increases on the surface of the inside wall 5 of the plasma processing chamber 86 (i.e., as the state of contamination advances), the scattered light component becomes larger than the specular reflection component, and as a result the difference in the signal strength depending on the beam scanning position becomes gradually smaller as shown in FIG. 9, FIG. 10, FIG. 11, and FIG. 12 one by one. Therefore, if in advance a relationship between the thickness of the reaction products deposited that indicates the status of contamination of the inside wall 5 of the plasma processing chamber 86 and variations in the profile of the reflected (scattered) light signal in accordance with the position of detection extracted from the lock-in amplifier 51$b$ is investigated and inputted in a storage device 40 for storage, the computer 42 becomes capable for monitoring the state of contamination of the inside wall 5 of the plasma processing chamber 86.

Note that since the inside wall 5 of the plasma processing chamber 86 is usually of a cylinder type, where it is not contaminated, when the beam 103 is projected being shifted from the center of a wafer, the propagation optical axis of the reflected light from the inside wall 5 is mis-aligned from the irradiation beam optical axis and hence the reflected light hardly enters the scattered-light detecting optical system 2001, as shown in FIG. 7.

On the other hand, the state of contamination advances as shown in FIG. 8, when the beam 103 is projected being shifted from a wafer center, a larger amount of scattered light is generated from the inside wall 5 and hence some enters on the scattered-light detecting optical system 2001 to effect detection.

Thereat, if the rotation angle of the Galvano mirror 25 is detected and the amount of shifting of the beam 103 from the wafer center (position of detection) is specified, and if in advance a relationship between the thickness of the deposited reaction products that indicates the status of contamination of the inside wall 5 at the specified position and the variation in signal strength of the reflected (scattered) light at the specified position that is extracted from the lock-in-amplifier 51$b$ is investigated and inputted into the storage device 40 for storage, the computer 42 is now given the capability of monitoring the state of contamination of the inside wall 5 of the plasma processing chamber 86.

On the other hand, among reflected light (scattered light) rays from the inside wall 5 of the plasma processing chamber 86, transmitted light passing through the beam splitter 27 does not fall on the foreign-material scattered light detecting optical fiber 33$a$ because it is cut off by the spatial filter 36.

As described in the foregoing, according to the first embodiment of the present invention, by virtue of the modulation and synchronous detection scheme, the intensity variation in the scattered light that indicates variations in the irregularity corresponding to the status of contamination of the inside wall can be separated, especially from that of the plasma emission, to effect detection in two regions of wavelength and frequency, and the status of contamination of the inside wall 5 can be detected with high sensitivity, and then based on the results, by devising a countermeasure such as washing, cleaning, the occurrence of foreign materials suspended in the plasma that stems from peeling off the reaction products adhering thereto etc. can be suppressed. Naturally, intensity variation in the scattered light that indicates variations in the irregularity corresponding to the status of contamination of the inside wall 5 can also be separated from that of the suspended foreign materials to effect detection.

Further, according to this first embodiment, by virtue of the modulation and synchronous detection scheme, a weak foreign-material scattered light can be separated from the plasma emission that becomes a problem in detecting the foreign materials in the plasma to effect detection; an effect that the detection sensitivity of the foreign materials suspended in the plasma is enhanced considerably compared to the conventional method that uses only wavelength separation can be attained, and the method according to this embodiment improves the minimum detection sensitivity as small as $\phi 0.2$ μm or so in contrast to a fact that the minimum detection sensitivity obtainable in the case of the conventional wavelength separation is $\phi 1$ μm or so at best, reaching a critical limit, so that an effect that it become possible to detect the foreign materials stable over the whole surface of the wafer can be obtained as well. Further, since the foreign materials are detected over the whole surface of the wafer and the number of the foreign materials, the size thereof, and the distribution thereof are judged, the operator can also confirm the information, for example, in the display 41 in real time.

Moreover, according to this first embodiment, since the status of contamination of the inside wall of the processing chamber can be monitored while the plasma is kept in emission, countermeasures such as washing and cleaning can be devised to suppress the sudden occurrence of a large quantity of suspended foreign materials to attain the improvement in the yield.

Furthermore, according to this first embodiment, since the state of contamination in the processing chamber can be judged in real time based on information on the number of the suspended foreign materials generated and detected, the size thereof, and the distribution thereof while the plasma is kept in emission, for example, the apparatus's rate of operation can be improved by optimization of a cleaning period, and the sudden occurrence of a large number of foreign materials can be found in an early stage, hence improving the yield.

In addition, according to this first embodiment, since the processing can be run while the state of contamination in the processing chamber can always be monitored, semiconductor substrates and liquid crystal substrates manufactured in this way become high-quality and high-reliability products that were manufactured in an environment that dose not include the foreign materials exceeding a reference value.

What is more, according to this first embodiment, since it is possible to decrease frequency of the judgment on the state of contamination of the processing chamber using dummy wafers and the judgment on the state of contamination by means of sampling inspection, the cost of the dummy wafers is curtailed.

Figure 14:
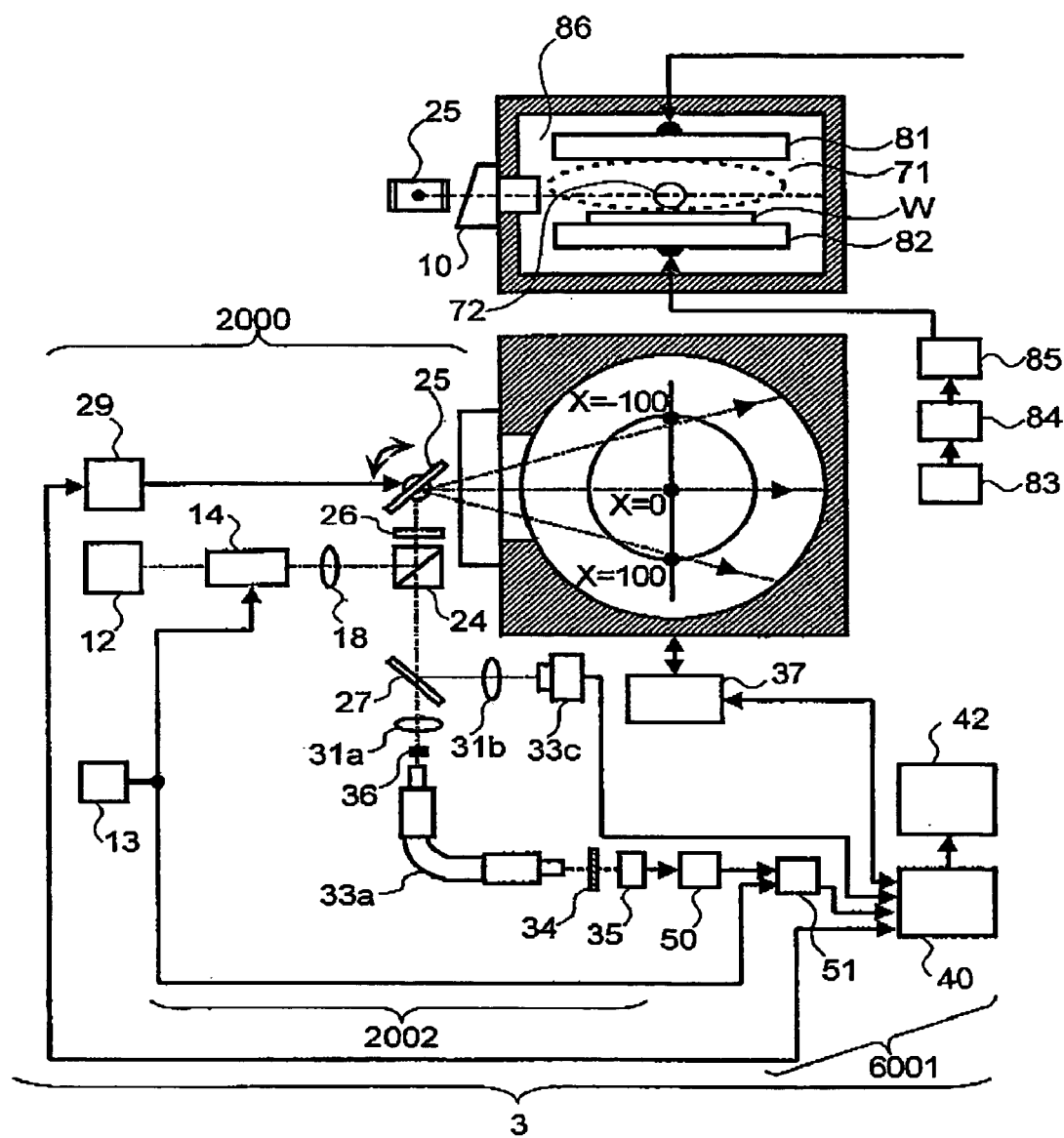
FIG. 14 shows a composition of the etching apparatus with the measurement instrument for suspended foreign material in plasma, having the function of monitoring the state of contamination of inside wall of processing chamber, according to a second embodiment of the present invention.
Figure 15:
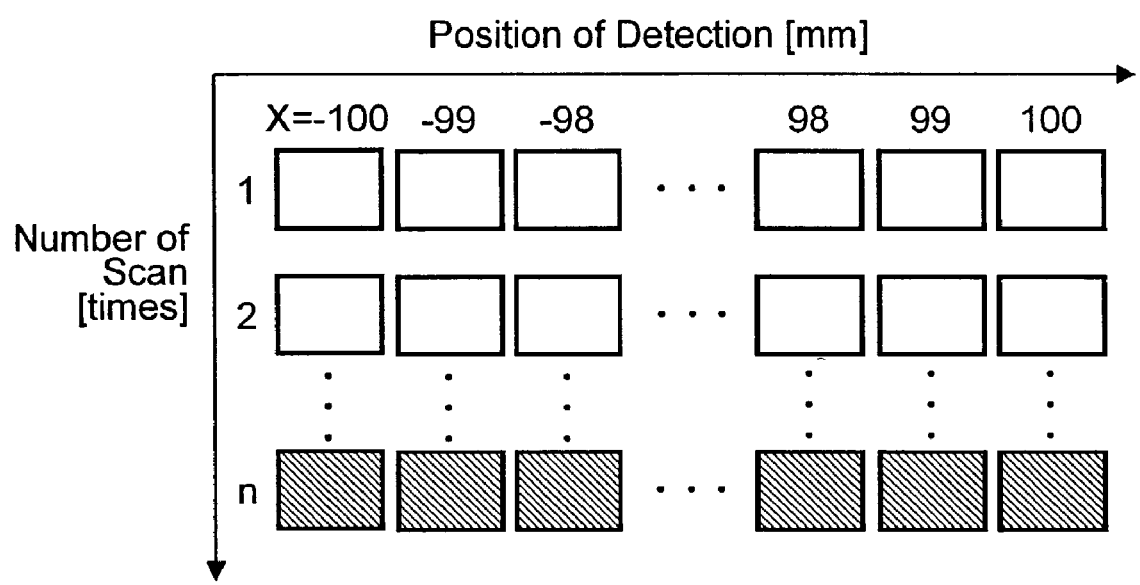
FIG. 15 shows images of the reflected (scattered light from the inside wall of the processing chamber according to the second embodiment of the present invention.

Next, referring to FIG. 14 and FIG. 15, a second embodiment according to the present invention will be described. FIG. 14 shows a composition of an etching apparatus that has the measurement instrument for suspended foreign material in plasma equipped with the function of monitoring the state of contamination of inside wall of processing chamber, according to this second embodiment.

The measurement instrument for suspended foreign material in plasma equipped with the function of monitoring the state of contamination of inside wall of processing chamber is mainly composed of a laser illumination optical system 2000, a scattered-light detecting optical system 2002, and a control and signal processing system 6001, wherein the laser illumination optical system 2000 and the scattered-light detecting optical system 2002 have an illumination light exist and a detected light entrance, respectively, both of which are arranged so as to face the observation window 10 provided on a side of the plasma processing chamber 86.

In this second embodiment, points different from the first embodiment are that the reflected (scattered) light from the inside wall 5 of the plasma processing chamber 86 is detected with an image pickup device 33*c* such as a CCD camera and the state of contamination of the inside wall 5 of the plasma processing chamber 86 is judged from images obtained by the said image pickup device 33*c* such as an CCD camera. That is, since depending on the state of surface irregularity of the inside wall 5 of the plasma processing chamber 86 a generated speckle pattern varies, if the said speckle pattern is taken with the image pickup device 33*c* as shown in FIG. 15, a slight variation in the surface state of the inside wall 5 can be detected from a variation between speckle patterns that are detected based on said taken image signals. Immediately after the washing or cleaning, as the reaction products adhere to the surface of the inside wall 5 and/or plasma damages occur to effect development of the contamination, the surface of the inside wall 5 changes gradually from a state of being flat to a state of an increased amount of irregularity and accordingly from a state of speckle free to a state of enhanced speckle pattern. Then it becomes possible to detect the status of contamination of the side wall 5 as variations in the speckle pattern (for example, a variation in light and shade of the speckle pattern) by picking up the image of light reflected from the surface of the inside wall 5 with the image pickup device 33*c* whose light-receiving plane is disposed at the imaging position of the inside wall 5 and performing image processing (for example, differential processing (Laplacian filtering processing) in two-dimensional directions) of the said pickup image signals by the computer 42. However, with respect to light of the plasma emission, in order not to allow it to enter the picture taking device 33, it is necessary to filter (cut off) it with a filter 45 such as a wavelength fitter.

As described above, according to this second embodiment, the same effect as that of this first embodiment can be obtained, and in addition a state of the surface of the inside wall 5 of the plasma processing chamber can be saved as images.

Moreover, in the first and second embodiments, it is possible that the lateral scattered-light detecting optical system as depicted in the JP-A-No. 251252/1999 (denoted by a reference number 37 in FIG. 1 and FIG. 14) is used together.

As described in the foregoing, a diagnostic unit (this may be the computer 42 or may be other production line control apparatus) diagnoses the measured results of the state of contamination of the inside wall of the processing chamber and/or the measured results of the foreign materials suspended in the plasma or its vicinity, and the diagnostic results are fed back to the means for reducing adhesion of the reaction products on the inside wall of the processing chamber and on side walls of the electrodes (for example, the means for controlling the temperatures of the inside wall of the processing chamber and of the side walls of the electrodes, and the means for generating a magnetic field along the inside walls of the processing chamber) to control the said means, and thereby adhesion of the reaction products to the inside of the processing chamber can be reduced. Moreover, the diagnostic unit may be configured to remove the in-process substrate based on the diagnostic results, or further may direct a cleaning instruction to produce the effect of stopping the in-process substrate from being put into in the production line and executing the cleaning.

Moreover, according to the embodiment of the present invention, the minimum detection sensitivity for the foreign materials suspended in the plasma can be increased up to φ0.2 μm or so, hence enabling stable detection for the foreign materials over the whole surface of the wafer.

Besides, since based on the information on the number of the foreign materials generated, the size thereof, and the distribution thereof, the state of contamination in the processing chamber can be judged in real time, and at the same time the state of contamination of the inside wall of the processing chamber can be monitored, for example, the apparatus's rate of operation can be improved by optimization of a cleaning period and the sudden occurrence of a large number of foreign materials can be found in an early stage, hence improving the yield. In addition, since the processing can be run while the state of contamination in the processing chamber is always monitored, semiconductor substrates and liquid crystal substrates thus manufactured become high-quality and high-reliability products that were manufactured in an environment that dose not contain the foreign materials exceeding a reference value.

What is more, according to the embodiments, since it is possible to decrease the frequency of the judgment on the state of contamination of the processing chamber using the dummy wafers and the judgment on the state of contamination by means of sampling inspection, the cost of the dummy wafers is curtailed.

By virtue of these effects, real time monitoring of the state of contamination in the etching chamber now becomes possible, and there are born an effect that the occurrence of defective wafers due to adhesion of the foreign materials can be reduced and manufacture of the high-quality semiconductor devices becomes possible and an effect that when a cleaning period for the apparatus can be grasped correctly.

Moreover, since the frequency of checking operations for the foreign materials that use the dummy wafers prior to manufacturing operations can be reduced, there is born an effect of cost curtailment and an effect of improvement in productivity. In addition, the method has also an effect that automation of the production line becomes possible.

According to the present invention, since the state of contamination of the inside wall of the plasma processing chamber can be monitored, a countermeasure is properly conducted beforehand to effect the prevention of occurrence of a number of foreign materials and attain improvement in the yield, at the same time manufacture of the high-quality semiconductor devices becomes possible, and an effect is obtained that a cleaning period for the apparatus can be grasped correctly.

Furthermore, according to the present invention, there can be achieved effects that the configuration of the apparatus is simplified, and both the monitoring of the state of contamination of the inside wall of the plasma processing chamber and the monitoring of the foreign materials suspended in the plasma can be performed.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is calmed is:

1. A method for processing a specimen using a plasma, comprising:
   generating a plasma in a processing chamber in which the specimen is disposed;
   processing the specimen with the plasma generated in the processing chamber; and
   performing contaminant analysis, which includes:
   an irradiation operation for projecting and scanning a light beam into the processing chamber through an observation window of the processing chamber;
   a detection operation for detecting a reflected light signal corresponding to a reflected light of the projected light beam which is reflected from an inside wall of the processing chamber, the reflected light signal being detected by separating a wall-reflected light component from light emanated from the plasma; and
   a signal processing operation for obtaining information on a state of contamination of the inside wall of the processing chamber, by processing the wall-reflected light signal obtained at the detection operation, by referring to an electronic database storing predetermined relationships between candidate signals obtainable from said detection of light from said inside wall and corresponding states of inside-wall contamination, to derive a state of contamination corresponding to the wall-reflected light signal, from the electronic database.

2. A method for processing a specimen using a plasma according to claim 1, comprising
   a control operation for controlling the plasma processing of the specimen, based on the information on the state of contamination of the inside wall obtained at the signal processing operation.

3. A method for processing a specimen using a plasma according to claim 1, wherein at the detection operation, a specular reflection component of the reflected light from the inside wall of the processing chamber is formed by an imaging optical system, and detected by a detector.

4. A method for processing a specimen using a plasma according to claim 3, wherein at the detection operation, when the specular reflection component of the reflected light is formed by an imaging optical system through the observation window and detected by a detector, a light generated from the plasma in the processing chamber is cut off by a filter.

5. A method for processing a specimen using a plasma according to claim 1, wherein at the irradiation operation, the beam is projected into the inside of the processing chamber and scanned so as to be projected onto a plurality of locations on the inside wall of the processing chamber.

6. A method for processing a specimen using a plasma according to claim 1, wherein projecting the light beam into the inside of the processing chamber at the irradiation operation and detecting the reflected light at the detection operation are conducted through the same observation window.

7. A method for processing a specimen using a plasma according to claim 1, wherein at the detection operation, the reflected light from the inside wall of the processing chamber varies in accordance with a variation in a state of irregularity of the inside wall of the processing chamber.

8. A method for processing a specimen using a plasma according to claim 1, wherein at the irradiation operation, intensity of the light beam is modulated by a desired frequency and the light beam is projected into the inside of the processing chamber through the observation window.

9. A method for processing a specimen using a plasma according to claim 8, wherein at the signal processing operation, Information on the state of contamination of the inside wall of the processing chamber is obtained by extracting a light component which has a frequency which is the same as the desired frequency utilized for modulation.

10. A method for processing a specimen using a plasma according to claim 1, wherein at the detection operation, a light image limited by a diaphragm placed at an imaging position of the imaging optical system is received by a detector.

11. A method for processing a specimen using a plasma according to claim 1, wherein at the irradiation operation, the light beam to be projected into the inside of the processing chamber has a desired wavelength component, and at the detection operation, the desired wavelength component is separated from the reflected light.

12. A method for processing a specimen using a plasma, comprising:
   generating a plasma in a processing chamber in which a specimen is disposed;

processing the specimen with the plasma generated in the processing chamber;

performing contaminant analysis, which includes:

projecting a light beam into the inside of the processing chamber through an observation window;

splitting light reflected from the inside of the processing chamber in response to the projected light beam and passed through the observation window into at least suspended-material-reflected light components and wall-reflected light coponents;

obtaining information on suspended foreign material in the processing chamber by detecting the suspended-material-reflected light components of the split light using a suspension-detecting optical unit arranged to detect the suspended-material-reflected light components with respect to predetermined positions within a volume of said plasma; and obtaining information on a state of contamination of an inside wall of the processing chamber by detecting the wall-reflected light components of the split light using wall-detecting optical unit arranged to detect the wall-reflected light components with respect to predetermined positions on said inside wall;

wherein the obtaining information on the state of contamination refers to an electronic database storing predetermined relationships between candidate wall-reflected light components and corresponding states of inside-wall contamination, to derive the state of contamination corresponding to the wall-reflected light components, from the electronic database.

13. A method for processing a specimen using a plasma according to claim 12, comprising controlling the plasma processing of the specimen, based on information on the suspended foreign material in the processing chamber as obtained by the suspension-detecting optical unit, and based on information on the state of contamination of the inside wall of the processing chamber as obtained by the wall-detecting optical unit.

14. A method for processing a specimen using a plasma according to claim 12, wherein in the projecting, a light beam intensity of the light beam is modulated by a desired frequency and the light beam is projected into the inside of the processing chamber.

15. A method for processing a specimen using a plasma according to claim 14, wherein the obtaining information on the suspended foreign material in the processing chamber is obtained by extracting a light component of a desired frequency from the suspended-material-reflected light components of the split light.

16. A method for processing a specimen using a plasma according to claim 14, wherein the obtaining information on the state of contamination of the inside wall of the processing chamber is obtained by extracting a light component of a desired frequency from the wall-reflected light components of the split light.

17. A method for processing a specimen using a plasma according to claim 12, wherein both light beam projected into the inside of the processing chamber, and the light reflected from the inside of the processing chamber, pass through the same observation window.

18. A method for processing a specimen using a plasma according to claim 12, wherein at the obtaining of the information on the state of contamination of the inside wall of the processing chamber by detecting the wall-reflected light components of the split light, the suspended-material-reflected light components are cut off by a spatial filter.

19. A method for processing a specimen using a plasma, comprising:

generating a plasma in a processing chamber in which the specimen is disposed;

processing the specimen with the plasma generated in the processing chamber; and performing contaminant analysis, which includes;

an irradiation operation for projecting and scanning a light beam into the processing chamber through an observation window of the processing chamber;

a detection operation for detecting a reflected light signal corresponding to a reflected light of the projected light beam which is reflected from an inside wall of the processing chamber, the reflected light signal being detected by separating a wall-reflected light component from light emanated from the plasma; and a signal processing operation for obtaining information on a state of contamination of the inside wall of the processing chamber, by processing the wall-reflected light signal obtained at the detection operation by referring to an electronic database means for storing predetermined relationships between candidate signals obtainable from said detection of light from said inside wall and corresponding states of inside-wall contamination, to derive a state of contamination corresponding to the wall-reflected light signal, from the electronic database.

20. A method for processing a specimen using a plasma according to claim 19, comprising a control operation for controlling the plasma processing of the specimen, based on the information on the state of contamination of the inside wall obtained at the signal processing operation.

21. A method for processing a specimen using a plasma according to claim 19, wherein at the detection operation, a specular reflection component of the reflected light from the inside wall of the processing chamber is formed by an imaging optical system, and detected by a detector.

22. A method for processing a specimen using a plasma according to claim 21, wherein at the detection operation, when the specular reflection component of the reflected light is formed by an imaging optical system through the observation window and detected by a detector, a light generated from the plasma in the processing chamber is cut off by a filter.

23. A method for processing a specimen using a plasma according to claim 19, wherein at the irradiation operation, the beam is projected into the inside of the processing chamber and scanned so as to be projected onto a plurality of locations on the inside wall of the processing chamber.

24. A method for processing a specimen using a plasma according to claim 19, wherein projecting the light beam into the inside of the processing chamber at the irradiation operation and detecting the reflected light at the detection operation are conducted through the same observation window.

25. A method for processing a specimen using a plasma according to claim 19, wherein at the detection operation, the reflected light from the inside wall of the processing chamber varies in accordance with a variation in a state of irregularity of the inside wall of the processing chamber.

26. A method for processing a specimen using a plasma according to claim 19, wherein at the irradiation operation, intensity of the light beam is modulated by a desired frequency and the light beam is projected into the inside of the processing chamber through the observation window.

27. A method for processing a specimen using a plasma according to claim 26, wherein at the signal processing operation, information on the state of contamination of the inside wall of the processing chamber is obtained by extracting a light component which has a frequency which is the same as the desired frequency utilized for modulation.

28. A method for processing a specimen using a plasma according to claim 19, wherein at the detection operation, a light image limited by a diaphragm placed at an imaging position of the imaging optical system is received by a detector.

29. A method for processing a specimen using a plasma according to claim 19, wherein at the irradiation operation, the light beam to be projected into the inside of the processing chamber has a desired wavelength component, and at the detection operation, the desired wavelength component is separated from the reflected light.

* * * * *